United States Patent
Takemoto (10) Patent No.: US 9,865,641 B2
(45) Date of Patent: Jan. 9, 2018

(54) SOLID-STATE IMAGING DEVICE, MANUFACTURING METHOD THEREFOR, AND IMAGING APPARATUS

(71) Applicant: OLYMPUS CORPORATION, Tokyo (JP)

(72) Inventor: Yoshiaki Takemoto, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/007,704

(22) Filed: Jan. 27, 2016

(65) Prior Publication Data
US 2016/0141328 A1 May 19, 2016

Related U.S. Application Data

(63) Continuation of application No. PCT/JP2014/063453, filed on May 21, 2014.

(30) Foreign Application Priority Data

Aug. 13, 2013 (JP) .................. 2013-168177

(51) Int. Cl.
*H01L 31/0203* (2014.01)
*H01L 27/146* (2006.01)

(52) U.S. Cl.
CPC .... *H01L 27/14643* (2013.01); *H01L 27/1464* (2013.01); *H01L 27/1469* (2013.01);
(Continued)

(58) Field of Classification Search
CPC ......... H01L 27/14643; H01L 27/14632; H01L 27/1469; H01L 27/14636; H01L 27/14634; H01L 27/1464
(Continued)

(56) References Cited

U.S. PATENT DOCUMENTS

| 4,734,381 A * | 3/1988 | Mitchell | H01L 21/44 136/256 |
| 7,566,588 B2 * | 7/2009 | Kameyama | H01L 24/03 257/E31.117 |

(Continued)

FOREIGN PATENT DOCUMENTS

| JP | 2003-139820 A | 5/2003 |
| JP | 2005-26633 A | 1/2005 |

(Continued)

OTHER PUBLICATIONS

International Search Report dated Aug. 26, 2014, issued in counterpart Application No. PCT/JP2014/063453 w/ English translation (4 pages).

Primary Examiner — Vu A Vu
(74) Attorney, Agent, or Firm — Westerman, Hattori, Daniels & Adrian, LLP (57) ABSTRACT

A solid-state imaging device includes: a first chip including a pixel array in which a plurality of photoelectric conversion portions converting incident light into an electric signal are disposed; a second chip having an area in a plan view less than an area of the first chip in the plan view and electrically and physically connected to the first chip; and a support portion provided to cover an entire region which is not covered with the second chip in a surface of the first chip connected to the second chip and configured to support the first chip so that flatness of the first chip may be maintained.

6 Claims, 7 Drawing Sheets

(52) U.S. Cl.
CPC .. *H01L 27/14632* (2013.01); *H01L 27/14634* (2013.01); *H01L 27/14636* (2013.01)

(58) Field of Classification Search
USPC ........................................................ 257/433
See application file for complete search history.

(56) References Cited

U.S. PATENT DOCUMENTS

| | | | |
|---|---|---|---|
| 2006/0050454 | A1 | 3/2006 | Koudate et al. |
| 2008/0308928 | A1 | 12/2008 | Chang et al. |
| 2009/0315130 | A1* | 12/2009 | Ro .................... H01L 27/14618 257/432 |
| 2012/0199930 | A1 | 8/2012 | Hayashi |
| 2012/0280406 | A1 | 11/2012 | Domae |
| 2013/0009044 | A1* | 1/2013 | Inomata ................. H01L 22/32 250/208.1 |
| 2013/0320359 | A1* | 12/2013 | Hummler ................. G02B 6/43 257/80 |
| 2014/0035084 | A1* | 2/2014 | George ............... H01L 27/1469 257/432 |

FOREIGN PATENT DOCUMENTS

| | | |
|---|---|---|
| JP | 2006-49361 A | 2/2006 |
| JP | 2006-80145 A | 3/2006 |
| JP | 2010-245506 A | 10/2010 |
| JP | 2011-146527 A | 7/2011 |
| JP | 2012-164870 A | 8/2012 |

\* cited by examiner

SOLID-STATE IMAGING DEVICE, MANUFACTURING METHOD THEREFOR, AND IMAGING APPARATUS

This application is a continuation application based on PCT Patent Application No. PCT/JP2014/063453, filed on May 21, 2014, whose priority is claimed on Japanese Patent Application No. 2013-168177, filed Aug. 13, 2013. The contents of both the Japanese Application and the PCT Application are incorporated herein by reference.

BACKGROUND OF THE INVENTION

Field of the Invention

The present invention relates to a solid-state imaging device, and more particularly, to a laminated solid-state imaging device, a manufacturing method therefor, and an imaging apparatus including the solid-state imaging device.

Description of Related Art

In recent years, video cameras and electronic still cameras have come into wide general use. In such cameras, charge coupled device (CCD) type or amplification type solid-state imaging devices are used. The amplification type solid-state imaging devices introduce signal charges generated and accumulated by photoelectric conversion portions of pixels on which light is incident to amplification portions provided in the pixels and output signals amplified by the amplification portions from the pixels. In the amplification type solid-state imaging devices, a plurality of such pixels are arrayed in a 2-dimensional matrix form. As the amplification type solid-state imaging devices, for example, there are complementary metal oxide semiconductor (CMOS) solid-state imaging devices in which CMOS transistors are used.

In CMOS solid-state imaging devices of the related art, a scheme in which circuit units provided in the same substrate sequentially read signal charges generated by photoelectric conversion portions of pixels arrayed in a 2-dimensional matrix form for each row is adopted. In CMOS solid-state imaging devices having general monolithic structures (structures manufactured from a single semiconductor substrate), peripheral circuits such as vertical scanning circuits, horizontal scanning circuits, column processing circuits, and output circuits are disposed in the periphery of a pixel array unit converting incident light into signal charges when viewed from a surface on which light is incident. Further, wirings are provided for each row or each column between the pixel may unit and the peripheral circuits in order to deliver electric signals.

At present, in CMOS solid-state imaging devices, there are demands to improve data rates, improve imaging identity in a plane, and provide high functions. In the CMOS solid-state imaging device having the monolithic structure, however, it is difficult to improve performance due to speed restriction or density restriction by electric conduction in a plan direction. Accordingly, as such CMOS solid-state imaging devices, various solid-state imaging devices configured as single devices by electrically connecting semiconductor chips in which pixel regions where a plurality of pixels are arrayed are formed to semiconductor chips in which logical circuits performing signal processing are formed have been proposed to improve functions and performance.

Japanese Unexamined Patent Application, First Publication No. 2006-049361 discloses a semiconductor module in which a backside irradiation type image sensor chip which has a micro pad in units of pixels and a signal processing chip in which a signal processing circuit is formed and which has the micro pad are connected by a micro bump. Japanese Unexamined Patent Application, First Publication No. 2010-245506 discloses a configuration in which backside irradiation type solid imaging devices are formed by bonding a first semiconductor wafer including semi-finished pixel array units and a second semiconductor wafer including semi-finished logical circuits and subsequently performing separation by dicing or the like.

SUMMARY OF THE INVENTION

According to a first aspect of the present invention, a solid-state imaging device includes: a first chip including a pixel array in which a plurality of photoelectric conversion portions converting incident light into an electric signal are disposed; a second chip having an area in a plan view less than an area of the first chip in the plan view, the second chip being physically connected to the first chip; a connection portion disposed between the first chip and the second chip, the connection portion being configured to electrically connect the first chip and the second chip; and a support portion provided to cover an entire region which is not covered with the second chip in a surface of the first chip connected to the second chip, the support portion being configured to support the first chip so that flatness of the first chip may be maintained.

According to a second aspect of the present invention, in the solid-state imaging device according to the first aspect of the present invention, the support portion may be formed of a resin or glass.

According to a third aspect of the present invention, in the solid-state imaging device according to the first or second aspect of the present invention, the support portion may be disposed to surround a periphery of the second chip in the plan view of the solid-state imaging device.

According to a fourth aspect of the present invention, in the solid-state imaging device according to any one of the first to third aspects of the present invention, a thickness of the support portion may be greater than a thickness of the second chip. The second chip may be covered with the support portion.

According to a fifth aspect of the present invention, in the solid-state imaging device according to any one of the first to fourth aspects of the present invention, the first chip may include an input/output terminal for external connection. The input/output terminal may be provided at a position at which the input/output terminal does not overlap with the second chip in the plan view of the solid-state imaging device.

According to a sixth aspect of the present invention, in the solid-state imaging device according to any one of the first to fifth aspects of the present invention, the first chip may include a test terminal for external connection. The test terminal may be provided at a position at which the test terminal does not overlap with the second chip in the plan view of the solid-state imaging device.

According to a seventh aspect of the present invention, an imaging apparatus includes the solid-state imaging device according to any one of the first to sixth aspects of the present invention.

According to an eighth aspect of the present invention, a method of manufacturing a solid-state imaging device, Which includes: a first chip including a pixel array in which a plurality of photoelectric conversion portions converting incident light into an electric signal are disposed; a second chip having an area in a plan view less than an area of the first chip in the plan view and physically connected to the first chip; and a connection portion disposed between the first chip and the second chip and configured to electrically connect the first chip and the second chip, includes: a second chip connection step of disposing the second chip on the first chip and electrically connecting the first chip and the second chip; a support portion forming step of filling a liquid support portion material on the first chip and solidifying the liquid support portion material to form a support portion; and a thinning step of thinning the first chip.

According to a ninth aspect of the present invention, in the method of manufacturing the solid-state imaging device according to the eighth aspect of the present invention, in the second chip connection step, a plurality of first chips may be formed in a first chip wafer, and the second chip may be disposed on each of the plurality of first chips on the first chip wafer.

According to a tenth aspect of the present invention, in the method of manufacturing the solid-state imaging device according to the eighth or ninth aspect of the present invention, the support portion forming step may be performed subsequently to the second chip connection step. In the support portion forming step, the support portion material may be filled so that the second chip may be covered with the support portion material.

BRIEF DESCRIPTION OF THE DRAWINGS

The top of FIG. 2 is a front view showing the solid-state imaging device and the bottom is a plan view showing the solid-state imaging device.

The top of FIG. 9 is a plan view showing a solid-state imaging device according to a second embodiment of the present invention and the bottom is a bottom view showing the solid-state imaging device.

DETAILED DESCRIPTION OF THE INVENTION

First Embodiment

Figure 1:
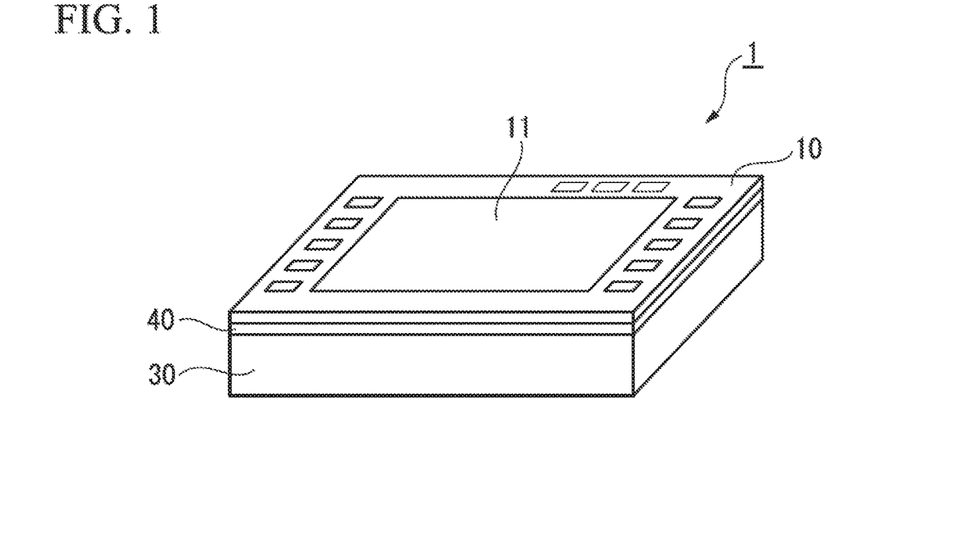
FIG. 1 is a perspective view schematically showing a solid-state imaging device according to a first embodiment of the present invention.
Figure 2:
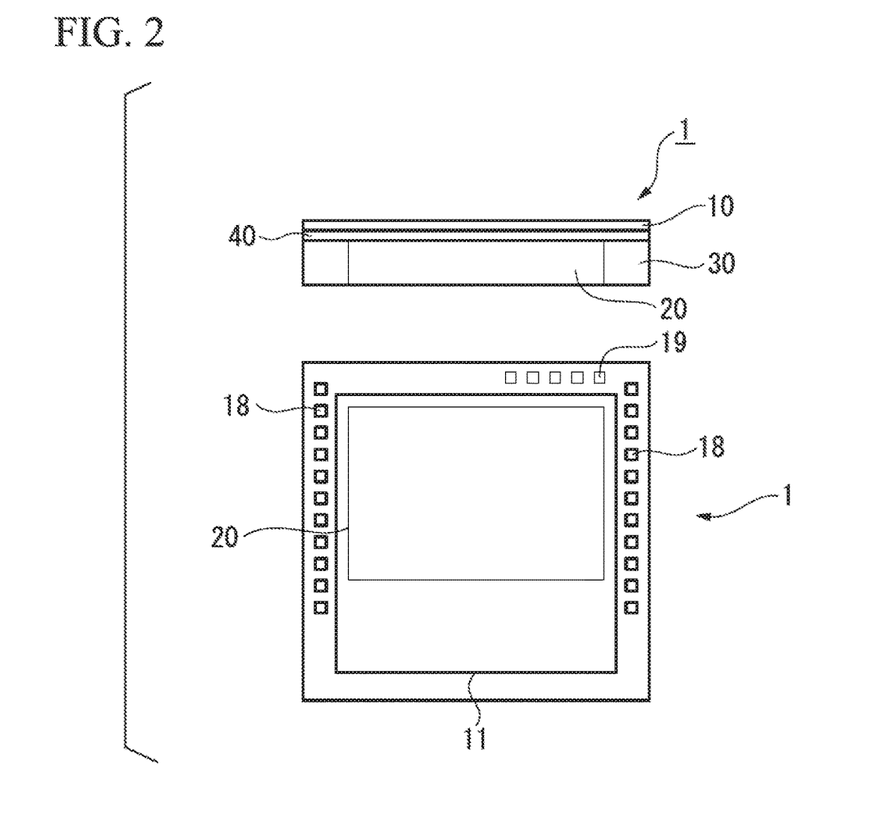

A first embodiment of the present invention will be described with reference to FIGS. 1 to 8. FIG. 1 is a perspective view schematically showing a solid-state imaging device 1 according to the embodiment of the present invention. The top of FIG. 2 is a front view showing the solid-state imaging device 1 and the bottom is a plan view showing the solid-state imaging device 1. As shown in FIGS. 1 and 2, the solid-state imaging device 1 includes a first chip 10 that includes a pixel array 11 in which a plurality of photodiodes (PDs, photoelectric conversion portions) are arrayed in a 2-dimensional form, a second chip 20 that is electrically connected to the first chip 10, and a support portion 30 that is disposed on the surface of the first chip 10 on the disposition side of the second chip 20 and supports the first chip 10.

The first chip 10 is formed of silicon. The PDs of the pixel array 11 convert incident light into an electric signal. The second chip 20 includes a reading circuit and a driving circuit (neither of which is shown), the reading circuit reads the electric signals obtained through the conversion by the PDs, and the driving circuit drives electric circuits in the first chip 10.

Figure 3:
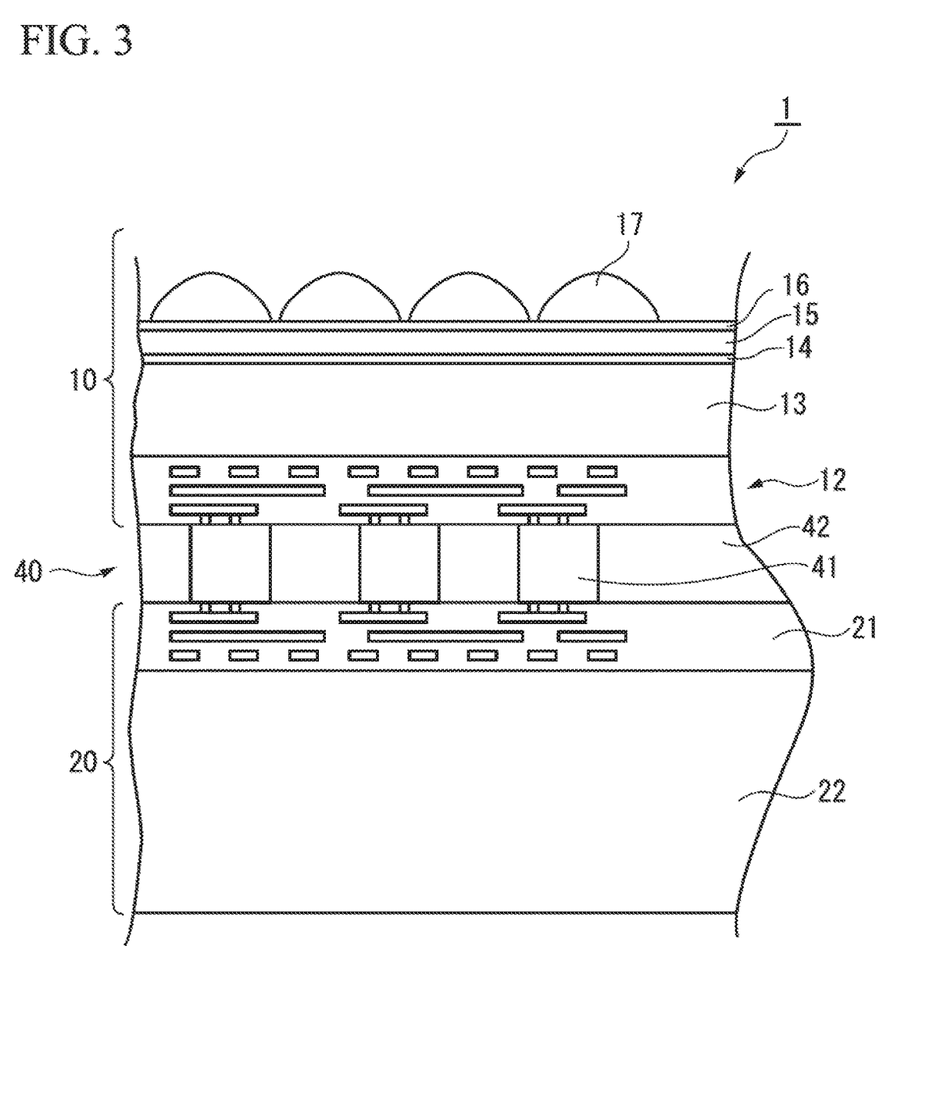
FIG. 3 is an expanded sectional view showing the periphery of a connection layer of the solid-state imaging device.

The first chip 10 and the second chip 20 are electrically and physically connected in a connection layer (connection portion) 40. FIG. 3 is a sectional view showing a region including an electric connection site of the first chip 10 and the second chip 20 in the connection layer 40. In the silicon portion of the first chip 10, a first wiring part 12 is provided on the opposite side to the second chip 20 and is connected to the PDs included in the pixel array 11. The remainder of the silicon portion is a thin silicon layer 13 through which light can be transmitted. An anti-reflection film 14, a color filter 15, a resin film 16, and micro lenses 17 are provided in this order on the silicon layer 13. The micro lenses 17 are disposed to correspond to the PDs of the pixel array 11 and guide light incident on the pixel array 11 to the corresponding PDs. As the material of the anti-reflection film 14, tantalum oxide, hafnium oxide, silicon nitride, or silicon dioxide can be used. As the color filter 15, a known material such as an organic film having dyestuff or pigment is used. The resin film 16 is provided to flatten a surface (incident surface) of the pixel array 11 on which the light is incident, but may be formed of the same material as the micro lenses 17.

As the first chip 10 has the above-described configuration, the solid-state imaging device 1 functions as a backside irradiation type solid imaging device in which the surface on the side on which the micro lenses 17 are provided is the incident surface. The first chip 10 is set to have a thickness of, for example, about 10 micrometers (μm) or less so that sufficient light is transmitted through the silicon layer 13.

A second wiring part 21 is provided on the side of the second chip 20 facing the first chip 10 and is connected to a reading circuit, a driving circuit, or the like provided in a silicon portion 22. The second chip 20 has a sufficiently thicker thickness than the first chip 10, for example, a thickness of 100 μm or more, enough to support the first chip 10 at the site of contact with the first chip 10. The first wiring part 12 and the second wiring part 21 are electrically connected by connection electrodes 41 provided in the connection layer 40. The gaps between the plurality of connection electrodes 41 are filled with a connection resin 42 which is also referred to as an underfill or the like. The connection resin 42 reinforces physical connection strength between the first chip 10 and the second chip 20. The connection resin 42 may be provided as necessary, and may not necessarily be provided.

As shown on the bottom in FIG. 2, the first chip 10 is larger than the second chip 20 in a plan view of the solid-state imaging device 1. Therefore, the first chip 10 has a partial region which does not overlap with the second chip 20. In this region, that is, the region which is not covered by the second chip 20 in the surface of the first chip 10 on the side of the second chip 20, the support portion 30 is disposed to be adhered to the first chip 10. As a result, the first chip 10 is supported by the support portion 30 so that flatness or the like is maintained.

In the periphery of the first chip 10, a plurality of bonding pads (input/output terminals) 18 used for connection with an external device and test terminals 19 used to test characteristics of the first chip 10 are provided. In the bonding pads 18, conductor surfaces are exposed to the side of the incident surface. In the test terminals 19, conductor surfaces are exposed to the surface on the opposite side to the incident surface. Therefore, when the solid-state imaging device 1 is finished, the conductor surfaces of the test terminals 19 are covered with the support portion 30 so that the conductor surfaces of the test terminals 19 are not visible. All of the bonding pads 18 and the test terminals 19 are provided at positions which do not overlap with the second chip 20 in a plan view of the solid-state imaging device 1.

An example of a method of manufacturing the solid-state imaging device 1 with the foregoing configuration will be described. First, as a preparation step, the plurality of first chips 10 are formed to be arranged in a 2-dimensional array form in one silicon wafer. Thereafter, this wafer is referred to as a "first chip wafer" (first chip preparation step). Further, the plurality of second chips 20 are formed to be arranged in a 2-dimensional array form in one silicon wafer and are separated by dicing or the like to manufacture the plurality of independent second chips 20. Since the second chips 20 can be arranged with sizes minimized depending on a necessary function with no gaps therebetween when manufactured, the maximum number of chips can be manufactured from one silicon wafer irrespective of the sizes of the first chips to be connected.

Figure 4:
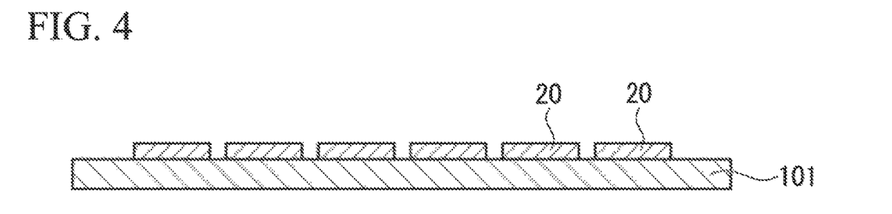
FIG. 4 is a diagram showing one process of a method of manufacturing the solid-state imaging device.

Next, as shown in FIG. 4, the second chip 20 is disposed on the first chip 10 (not shown) on a first chip wafer 101, and the first chip 10 and the second chip 20 are electrically connected (second chip connection step). In the embodiment, the connection layer 40 (not shown in FIG. 4) including the connection electrodes 41 is formed on the first chip wafer 101, and then the second chip 20 is disposed and connected by applying heat, pressure, or the like.

Figure 5:
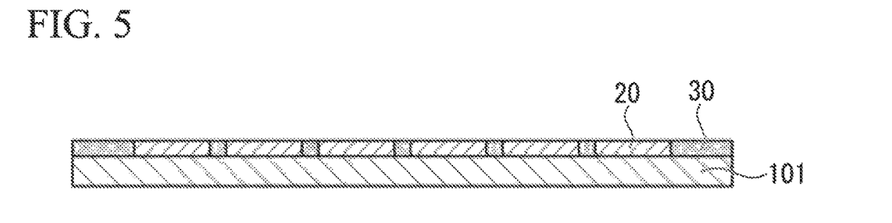
FIG. 5 is a diagram showing one process of the method of manufacturing the solid-state imaging device.

Next, as shown in FIG. 5, a liquid support portion material is filled on the first chip wafer 101 and the periphery of the second chip 20 and is solidified to form the support portion 30 (support portion forming step). As the support portion material, for example, a resin or glass can be used. In the embodiment, the thickness of the support portion is equal to the Thickness of the second chip 20, but the present invention is not limited thereto. The support portion may be formed to be thinner than the second chip or thicker than the second chip so that the support portion covers the second chip. Here, when the support portion is thinner than the second chip, it is noted that the support portion is configured to have a thickness providing sufficient rigidity to support the first chip. It is noted that there is no region which overlaps with neither the second chip nor the support portion in the plan view of the first chip 10. When the support portion is formed, the conductor surfaces of the test terminals are covered and not used. Therefore, when it is necessary to test characteristics of the first chip 10 or the second chip 20 or connection thereof, testing is performed before the support portion is formed.

Figure 6:
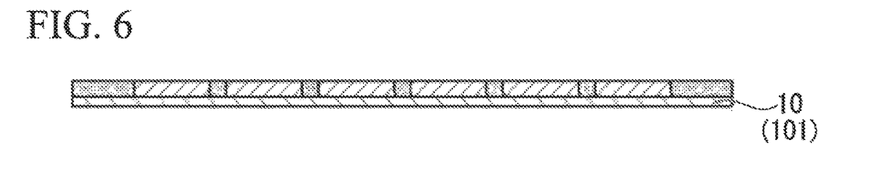
FIG. 6 is a diagram showing one process of the method of manufacturing the solid-state imaging device.

Next, as shown in FIG. 6, the first chip wafer 101 is thinned to form the plurality of first chips 10 (thinning step). As a thinning method, any of various known methods can be used. For example, a physical grinding step such as a back grinding (BG) step, chemical etching using a chemical solution, or chemical mechanical polishing (CMP) can be used. In general, the thickness of the first chip wafer 101 is about 700 μm before the thinning and is thinned to a film thickness for example, about 1 μm to about 5 μm) depending on characteristics required in the PDs of the first chip through a thinning step. In the thinning step, a silicon oxide film may be formed on the surface of the formed first chip.

Figure 7:
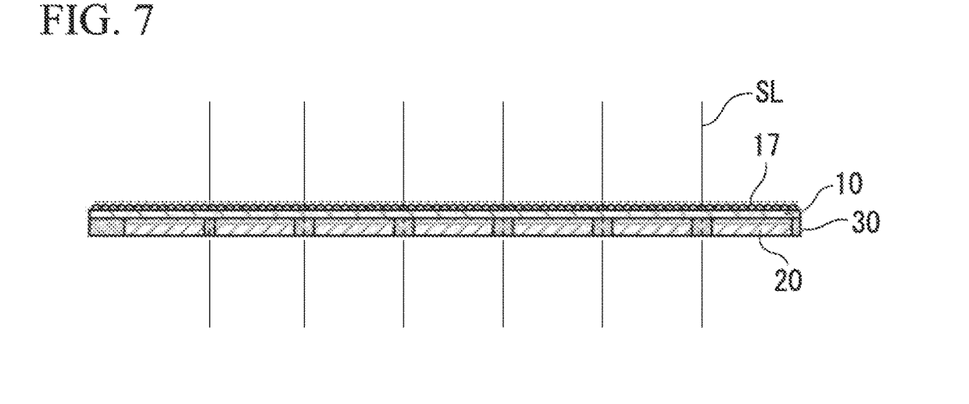
FIG. 7 is a diagram showing one process of the method of manufacturing the solid-state imaging device.

Next, as shown in FIG. 7, various mechanisms such as the micro lenses 17 and the bonding pads 18 are formed on the first chip 10. Since the various mechanisms are all minute, only the micro lenses 17 are shown in FIG. 7.

Figure 8:
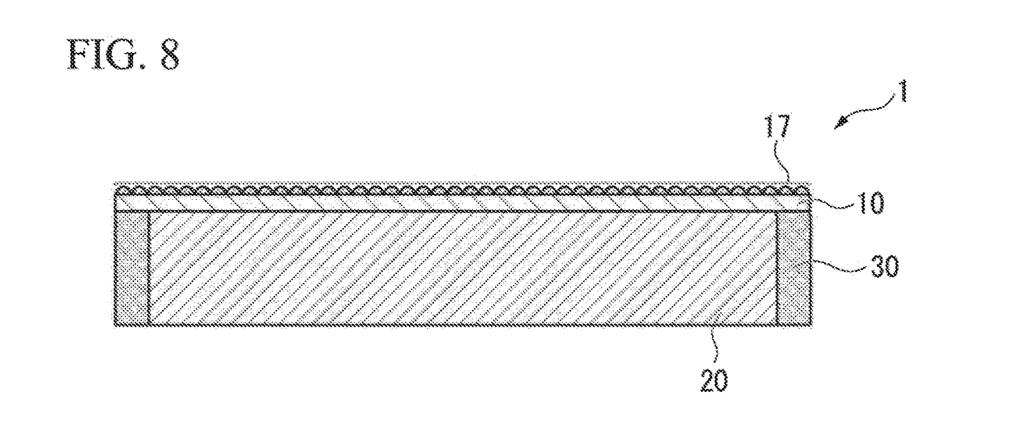
FIG. 8 is a diagram showing one process of the method of manufacturing the solid-state imaging device.

Finally, when each pair of the first chip 10 and the connected second chip 20 is separated along a boundary line (scribe line) SL of the individual first chip 10 by dicing or the like, the plurality of solid-state imaging devices 1 shown in FIG. 8 are manufactured. In the finished solid-state imaging device 1, a partial region of the thinned first chip 10 is supported by the second chip 20 and the remaining region is supported by the support portion 30. As a result, the first chip 10 including the pixel array 11 is maintained in a flat state, and thus light incident on the pixel array 11 is appropriately subjected to photoelectric conversion.

In the solid-state imaging device 1 according to the embodiment, the second chip 20 and the support portion 30 are provided on one surface of the first chip 10. Therefore, even when the area of the second chip 20 in the plan view is less than the area of the first chip 10 in the plan view, the entire last chip 10 is supported. Thus, the first chip 10, particularly the pixel array 11, can be appropriately prevented from being bent. That is, it is not necessary to set the dimensions of the second chip 20 more than necessary in consideration of the support of the first chip 10, and the second chip 20 can be set to have the dimensions minimized to realize a desired function. As a result, the number of second chips which can be manufactured from one wafer can be optimized regardless of the dimensions of the first chips, and thus the manufacturing cost can be considerably reduced.

Since the support portion 30 is disposed to surround the periphery of the second chip 20 in the plan view of the solid-state imaging device 1, a force to be applied to a side surface extending in the thickness direction of the solid-state imaging device 1 can be prevented from being directly applied to the second chip 20, and thus the second chip 20 can be appropriately protected. Further, even at the time of the separation, a dicing blade or the like rarely comes into contact with the second chip, and the second chip is rarely damaged.

Since the bonding pads 18 for external connection or the test terminals 19 are disposed at the positions which do not overlap with the second chip 20 in the plan view, an excessive force is rarely applied to the second chip 20 in a step of connecting an external device or the like by wire bonding or a characteristic test step, and thus the occurrence of malfunction of the second chip can be reduced.

Since the test terminals 19 are provided separately from the bonding pads 18, a characteristic test or the like can be performed without using the bonding pads, and thus reliability of the external connection via the bonding pads can be highly maintained.

Second Embodiment

A second embodiment of the present invention will be described with reference to FIGS. 9 and 10. A difference between a solid-state imaging device 51 according to the embodiment and the solid-state imaging device 1 according to the first embodiment is a circuit disposition form. In the following description, the same reference numerals are given to common configurations to the above-described configurations and a description thereof will be omitted.

Figure 9:
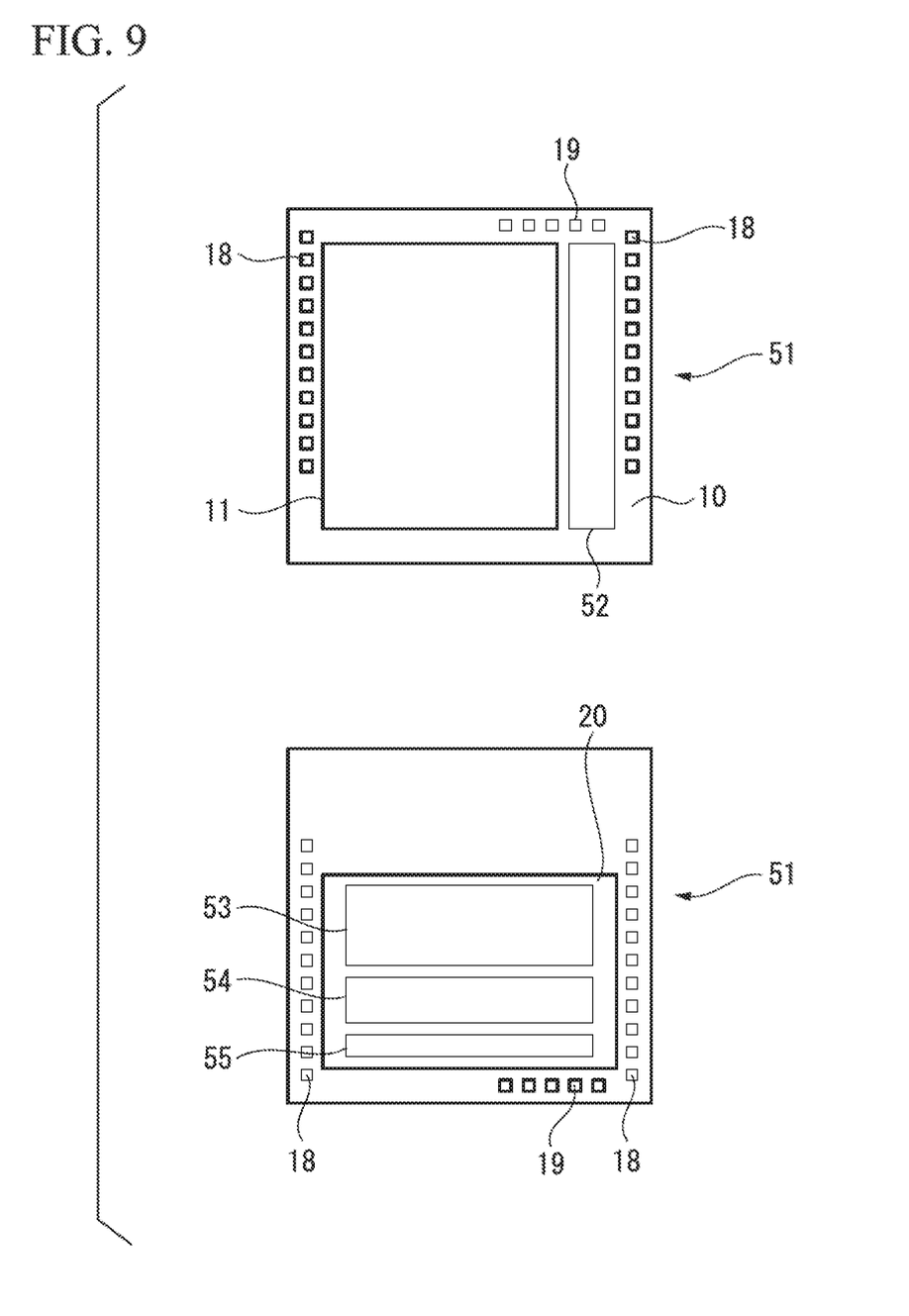

The top of FIG. 9 is a plan view of the solid-state imaging device 51. The bottom of FIG. 9 is a bottom view of the solid-state imaging device 51, and the support portion 30 is not shown. In the first chip 10, a vertical scanning circuit 52 which is a part of a reading circuit is provided in addition to the pixel array 11. The vertical scanning circuit 52 outputs an operational signal to function as the solid-state imaging device and is connected to the PDs of the pixel array 11 and the second chip 20. The second chip 20 includes a horizontal scanning circuit 53 which is a part of the reading circuit, and includes a column processing circuit 54 and an output circuit 55 forming a driving circuit.

In the solid-state imaging device 51 according to the embodiment, as described above, some of the functions of the second chip are realized in the first chip. However, even in this configuration, it is possible to obtain the same advantageous effects as the solid-state imaging device described in the first embodiment. Further, for example, when the first chip includes dead space and some of the circuits of the second chip can be disposed in the dead space, some of the circuits can be provided in the first chip, so that the second chip can be further miniaturized, and thus it is possible to improve the manufacturing efficiency of the second chip.

Figure 10:
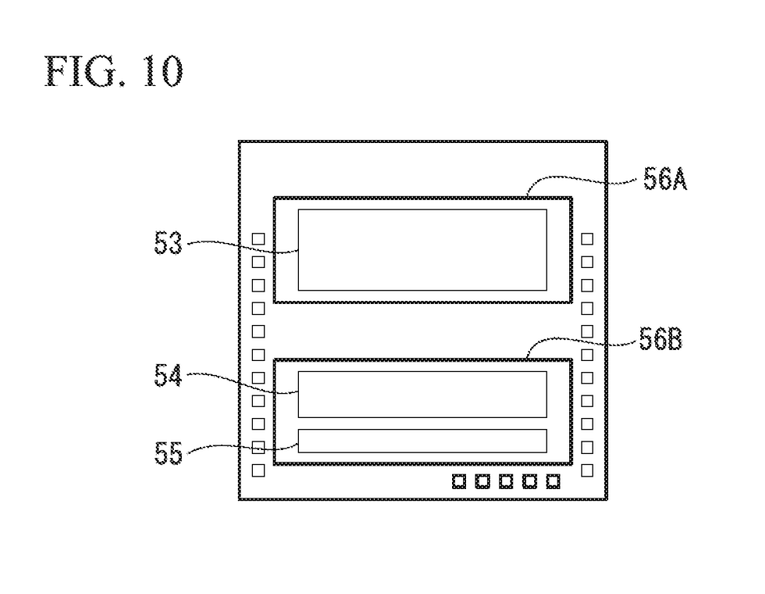
FIG. 10 is a bottom view showing the solid-state imaging device according to a modified example.

In the embodiment, as in a modified example shown in FIG. 10, the circuits of the second chip may be distributed and disposed in two independent function chips 56A and 56B so that the second chip is configured by the two function chips. When a problem arises in some of the circuits in such a configuration, only the function chip including the circuits in which the problem arises may be exchanged. Therefore, it is possible to further improve manufacturing yield of the second chip. There is also the advantageous effect that the degree of freedom of the disposition of the second chip increases. Accordingly, the second chip may be configured by three or more function chips, and there is no particular restriction on disposition of the circuits of each function chip.

Figure 11:
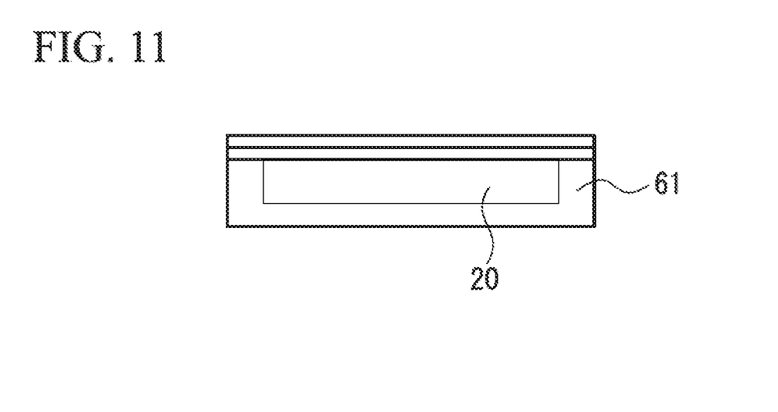
FIG. 11 is a front view showing a solid-state imaging device according to a modified example of the present invention.

In the foregoing embodiments, as in a modified example shown in FIG. 11, a support portion 61 may be formed to be thicker than the thickness of the second chip 20, and the second chip 20 may be covered with the support portion 61. In such a configuration, it is easy to fill a support portion material in a support portion forming step, and the second chip is also appropriately protected in the finished solid-state imaging device.

The support portion may not necessarily be formed to surround the periphery of the second chip in the plan view of the solid-state imaging device. As a result, a part of the second chip may be exposed to a side surface of the solid-state imaging device. Here, when the support portion is formed to surround the periphery of the second chip, there are some advantageous effects, as described above in the first embodiment.

The second chip may further have a function other than the above-described functions, for example, an analog/digital (A/D) conversion function.

Figure 12:
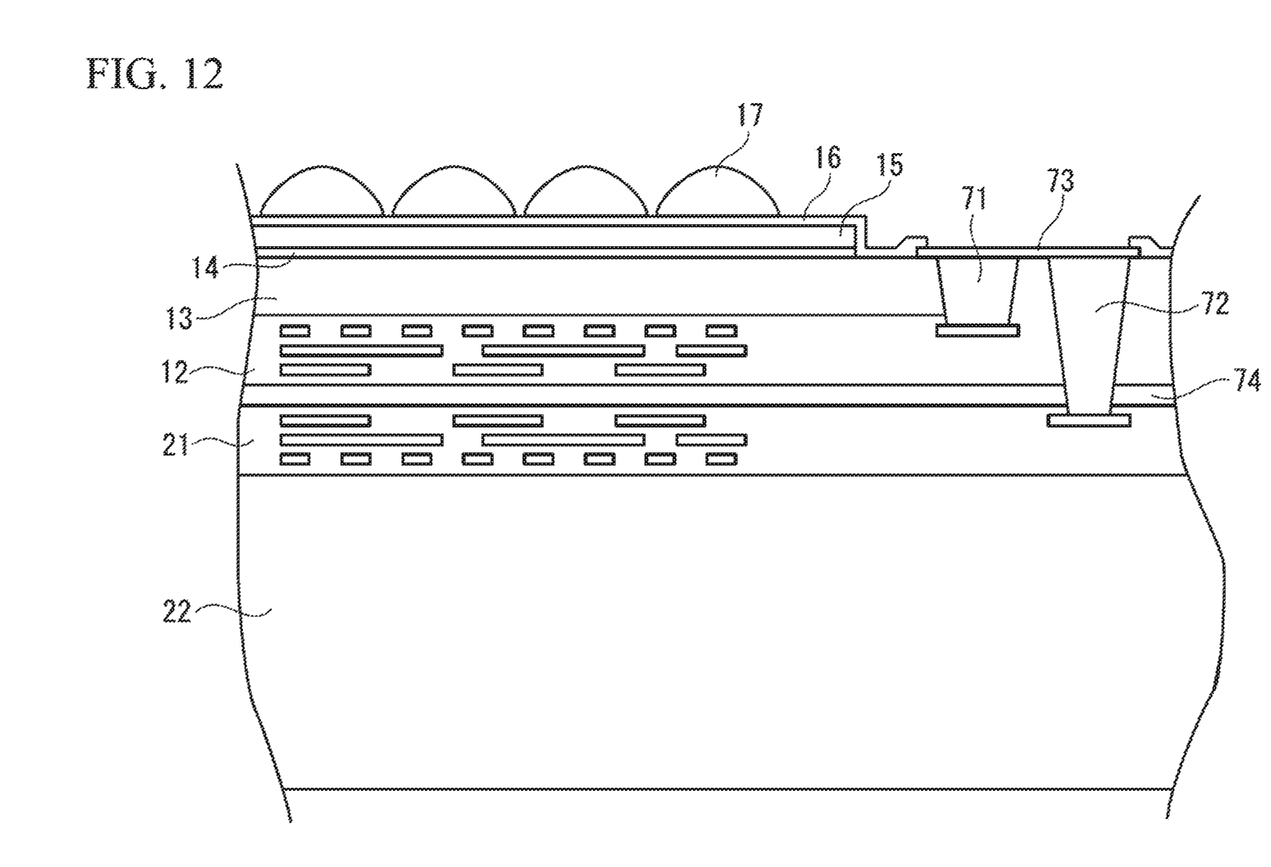
FIG. 12 is an expanded sectional view showing the periphery of a connection layer of a solid-state imaging device according to a modified example of the present invention.

Further, the electric connection form of the first and second chips is not limited to the above-described connection via the connection layer. For example, as in a modified example shown in FIG. 12, vias (through silicon vias: TVs) 71 and 72 may be formed in the first chip 10 and the second chip 20 respectively, and the vias 71 and 72 may be configured to be connected by a connection film 73 formed of a conductor. In this case, the first wiring part 12 and the second wiring part 21 may be physically connected by direct bonding of silicon oxides contained in the first wiring part 12 and the second wiring part 21, or may be connected via a buffer layer 74 formed of a silicon oxide or the like and formed with a composition appropriate for direct bonding.

In the method of manufacturing the solid-state imaging device according to the foregoing embodiments, the sequence of the steps can be appropriately changed within the scope of the present invention without departing from the gist of the present invention. For example, the thinning step may be performed before the second chip connection step or the support portion forming step, or the second chip connection step may be performed after the first chip wafer is separated in each region corresponding to the first chip in advance.

The solid-state imaging device according to the foregoing embodiments can be appropriately used in any of various imaging apparatuses such as digital cameras or digital video cameras. In particular, the solid-state imaging device can be appropriately used in, for example, a high-speed photographing video camera in which a high data rate is required, a monitoring camera in which imaging identity in a surface is required, a special industrial camera or the like, or a medical imaging apparatus in which miniaturization of a sensor is required.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A solid-state imaging device comprising:
    a first chip including a pixel array in which a plurality of photoelectric conversion portions converting incident light into an electric signal are disposed, a thickness of the first chip being less than 10 micrometers;
    a second chip having an area in a plan view less than an area of the first chip in the plan view, the second chip being physically connected to the first chip;
    a connection portion disposed between the first chip and the second chip, the connection portion being configured to electrically connect the first chip and the second chip; and
    a support portion provided to cover an entire region which is not covered with the second chip in a surface of the first chip connected to the second chip, the support portion being configured to support the first chip so as to maintain flatness of the first chip,
    wherein the first chip includes a test terminal for external connection, and
    the test terminal is provided at a position at which the test terminal does not overlap with the second chip in the plan view of the solid-state imaging device.

2. The solid-state imaging device according to claim 1, wherein the support portion is formed of a resin or glass.

3. The solid-state imaging device according to claim 1, wherein the support portion is disposed to surround a periphery of the second chip in the plan view of the solid-state imaging device.

4. The solid-state imaging device according to claim 1, wherein a thickness of the support portion is greater than a thickness of the second chip, and the second chip is covered with the support portion.

5. The solid-state imaging device according to claim 1, wherein the first chip includes an input/output terminal for external connection, and the input/output terminal is provided at a position at which the input/output terminal does not overlap with the second chip in the plan view of the solid-state imaging device.

6. An imaging apparatus comprising the solid-state imaging device according to claim 1.

\* \* \* \* \*